United States Patent
Pahl (10) Patent No.: US 11,787,689 B2
(45) Date of Patent: Oct. 17, 2023

(54) MEMS DEVICE WITH PARTICLE FILTER AND METHOD OF MANUFACTURE

(71) Applicant: TDK Corporation, Tokyo (JP)

(72) Inventor: Wolfgang Pahl, Munich (DE)

(73) Assignee: TDK Corporation, Tokyo (JP)

( * ) Notice: Subject to any disclaimer, the term of this patent is extended or adjusted under 35 U.S.C. 154(b) by 373 days.

(21) Appl. No.: 16/630,036

(22) PCT Filed: Jul. 4, 2018

(86) PCT No.: PCT/EP2018/068092
§ 371 (c)(1),
(2) Date: Jan. 10, 2020

(87) PCT Pub. No.: WO2019/011748
PCT Pub. Date: Jan. 17, 2019

(65) Prior Publication Data
US 2021/0114866 A1    Apr. 22, 2021

(30) Foreign Application Priority Data
Jul. 10, 2017   (DE) .......................... 102017115407.8

(51) Int. Cl.
*B81C 1/00*   (2006.01)
*B81B 7/00*   (2006.01)
(Continued)

(52) U.S. Cl.
CPC ........ *B81C 1/00309* (2013.01); *B81B 7/0061* (2013.01); *H04R 19/04* (2013.01);
(Continued)

(58) Field of Classification Search
CPC .......... B81B 7/0061; B81B 2201/0235; B81B 2201/0242; B81B 2201/0257;
(Continued)

(56) References Cited

U.S. PATENT DOCUMENTS

| | | | |
|---|---|---|---|
| 6,706,201 B1 * | 3/2004 | Meyer | H05K 3/388 216/12 |
| 2002/0172382 A1 | 11/2002 | Nakabayashi | |
| 2012/0093346 A1 * | 4/2012 | Feiertag | H04R 19/005 381/174 |
| 2012/0237073 A1 * | 9/2012 | Goida | H04R 1/02 381/361 |

(Continued)

FOREIGN PATENT DOCUMENTS

| | | |
|---|---|---|
| CN | 201114761 Y | 9/2008 |
| CN | 101547386 A | 9/2009 |

(Continued)

OTHER PUBLICATIONS

DuPon/\TM Kapton ® Summary of Properties, 2021 (Year: 2021).*
(Continued)

*Primary Examiner* — Shahed Ahmed
*Assistant Examiner* — Sun Mi Kim King
(74) *Attorney, Agent, or Firm* — Nixon Peabody LLP (57) ABSTRACT

A MEMS sensor with a media access opening in its carrier board. The MEMS sensor has an integrally filter mesh closing the media access opening. The mesh can be applied in unstructured form over the whole surface of the carrier board. Then, a structuring is performed to produce preferably at the same time a perforation forming the filter mesh.

16 Claims, 5 Drawing Sheets

(51) Int. Cl.
*H04R 19/04* (2006.01)
*H04R 31/00* (2006.01)
*H04R 1/04* (2006.01)

(52) U.S. Cl.
CPC ...... *H04R 31/00* (2013.01); *B81B 2201/0235* (2013.01); *B81B 2201/0242* (2013.01); *B81B 2201/0257* (2013.01); *B81B 2201/0264* (2013.01); *B81B 2201/0271* (2013.01); *B81B 2201/0292* (2013.01); *B81B 2207/012* (2013.01); *B81B 2207/99* (2013.01); *B81C 2201/0132* (2013.01); *B81C 2201/0143* (2013.01); *B81C 2203/0109* (2013.01); *B81C 2203/032* (2013.01); *H04R 1/04* (2013.01); *H04R 2201/003* (2013.01)

(58) Field of Classification Search
CPC .... B81B 2201/0264; B81B 2201/0271; B81B 2201/0292; B81B 2207/012; B81B 2207/99; B81C 1/00309; B81C 2201/0132; B81C 2201/0143; B81C 2203/0109; B81C 2203/032; H04R 19/04; H04R 31/00; H04R 1/04; H04R 2201/003; H04R 19/005; H04R 1/086; H01L 2224/16; H01L 2224/48137; H01L 2924/10158

See application file for complete search history.

(56) References Cited

U.S. PATENT DOCUMENTS

| | | | |
|---|---|---|---|
| 2014/0061892 A1* | 3/2014 | Ziglioli | B81C 1/00333 257/704 |
| 2015/0237431 A1 | 8/2015 | Jeziorek | |
| 2016/0112809 A1* | 4/2016 | Zinn | H04R 19/005 381/174 |
| 2018/0035203 A1 | 2/2018 | Hirai | |

FOREIGN PATENT DOCUMENTS

| | | | | |
|---|---|---|---|---|
| CN | 202334882 U | | 7/2012 | |
| CN | 103391501 A | * | 11/2013 | |
| CN | 104811889 A | | 7/2015 | |
| EP | 2703338 A1 | | 3/2014 | |
| JP | 2008-271426 A | | 11/2008 | |
| WO | WO 2016/136233 A1 | | 9/2016 | |
| WO | WO-2018064804 A1 | * | 4/2018 | ........ B81B 7/0061 |

OTHER PUBLICATIONS

International Search Report corresponding to International Patent Application No. PCT/EP2018/068092, dated Oct. 23, 2018 (3 pages).

Written Opinion of International Searching Authority corresponding to International Patent Application No. PCT/EP2018/068092, dated Oct. 23, 2018 (8 pages).

* cited by examiner

Fig 9 d) AP, F, CB e) F, ML f) F, ML g) B, F, ML h) BH, F i) PF, MSH

MEMS DEVICE WITH PARTICLE FILTER AND METHOD OF MANUFACTURE

CROSS-REFERENCE TO RELATED APPLICATIONS

This application is a U.S. National Stage of International Application No. PCT/EP2018/068092, filed Jul. 4, 2018, which claims the benefit of Germany Patent Application No. 102017115407.8, filed Jul. 10, 2017, both of which are incorporated herein by reference in their entireties.

Various types of MEMS components need package openings serving as environmental access ports, e.g. pressure sensors, gas sensors, and sensors for ultrasonic or audible sound (i.e. microphones), as well as actors like ultrasonic emitters.

Depending on construction and requirements of such components, they are prone to functional degradation or total failure caused by particles entering this port and interfering with the sensible internal structures.

In particular, capacitive MEMS microphones are affected by this problem. In principle, the acoustoelectric transducer consists of two or more parallel plates, at least one of them ("membrane") is impermeable and moveable, at least one other ("back plate") is perforated and rigid. For optimized performance, the distance between these plates is very small (typically 1 . . . 5 µm) to achieve good signal sensitivity while the individual perforation openings are relatively wide (typically 5 . . . 10 µm) to minimize air flow resistance and noise. It is obvious that particles small enough to pass through the openings are big enough to block the gap and disturb the free movement of the membrane induced by the sound pressure.

It is common practice to apply a protective member (mesh, fabric) between the component port and the case port during assembly of, for example, a mobile phone to keep off dust and moisture. However, the component is not protected before and particularly during this assembly process that is often not executed under strict clean room conditions. This causes yield loss and reliability issues.

Hence, it is an object of the present invention to provide a MEMS device and preferably a MEMS microphone that has an improved particle filter that does not worsen the mechanical and electrical device performance too much. A further object is to provide a particle filter for the media access opening of the MEMS sensor that is easy to manufacture and that detains smaller particles better than known dust grids.

At least one of these objects is met by a MEMS sensor according to claim 1. Preferred embodiments and variations as well as a method for manufacture can be taken from the further claims.

A MEMS sensor comprises inter alia a MEMS chip that is mounted on a carrier board. A media access opening in the carrier board allows an interaction of the environment with the MEMS sensor that at least one current environmental parameter like pressure, temperature or humidity can be sensed by the sensor. To prevent particles from reaching the MEMS chip and its sensitive or movable structures a filter mesh is provided between media access opening and MEMS chip. This filter mesh is formed from a foil bonded onto the top surface of the carrier board by means of an adhesive. After applying in unstructured form this foil is structured by forming perforations in a perforation area above the media access opening before mounting the MEMS chip.

Such perforations can be formed with a diameter that is substantially smaller than the diameter of known particle filters used in current MEMS sensors. The foil is applied without perforations and hence, in an unstructured form that provides better handling ability as well a higher stability than a filter mesh as such. Further, the foil can be chosen from any suitable material that can be perforated. The filter mesh needs not be integral component of the carrier board and thus needs not be adapted to the carrier board in view of choice of material. As a consequence, the thickness of the foil can be substantially reduced in view of grid that is formed integrally with the carrier board and in view of a filter mesh that is attached to the surface in form of a mesh.

Structuring of a foil that is applied to a greater area than required can be done in the same step the perforations are formed.

When using the filter mesh for a MEMS sensor with a MEMS chip assembled in flip chip technique the low thickness allows arranging the filter below the chip since the solder bump gap between board and MEMS chip measures about 50 µm to 100 µm. The filter mesh according to the invention can be produced without problems with a thickness of 1 µm to 10 µm. Moreover, the filter mesh does not come too close to the MEMS chip's sensitive membrane like a back plate for example if the MEMS sensor is embodied as capacitive sensor like a microphone. Then, loss due to squeeze film damping is avoided. And finally, the filter mesh can be made thin enough and with a maximum perforation ratio that in the microphone case a good acoustic performance is achieved while maintaining a sufficient level of robustness.

The foil can be chosen from a polyimide foil like Kapton® for example. In addition, aromatic polyamides (aramids) like Kevlar® or Mictron® for example can be used. Moreover, a any polymer foil and of a metal foil may be useful too. In the area of the media access opening the foil preferably has a thickness of about 1 µm to 10 µm to avoid the above mentioned disadvantages. In the contact area where the foil is in direct contact with the carrier board and beyond the sensitive area of the MEMS chip and beyond the media access opening the foil can have greater thickness without disturbing the MEMS sensor's function. A higher thickness at the outer margin of the foil can provide a higher mechanical stability and robustness to the filter mesh.

The perforations comprises a plurality of holes each having preferably a diameter of 2 µm to 10 µm and being arranged in a regular pattern. A maximum perforation amount is seeked. It is possible to provide an area ratio of perforations relative to the perforation area of 30% or more, preferably of 50% or more.

The MEMS chip has a sensing surface that normally comprises a movable micro structured part like a membrane. The MEMS chip is mounted to the carrier board above the foil thereby keeping a distance between the perforation area of the foil and the sensing surface of at least 10 µm, preferably of at least 50 µm. Then a suitable trade-off between bump height and foil thickness can be made. However it is preferred to minimize both of these geometric dimensions.

In an embodiment the carrier board has a multilayer structure of at least two dielectric layers sandwiching a wiring layer there between. Then, the media access opening can be structured at the same time ad together with structuring the respective dielectric layer. One of the dielectric layers can comprises a plurality of through going holes in the area of the media access opening to provide a filter grid spanning across the media access opening. Any other or all dielectric layers have one hole/opening only according to the diameter of the media access opening. In case of the grid formed in a dielectric layer in the area of the media access opening the diameter of the holes is greater than the diameter of the perforations in the foil. Then a two-stage filtering is possible with a rough filter grid as first stage and a finer filter mesh as a second stage.

In an embodiment the carrier board consists of a multi-layer laminate with internal electrical connections, vias, and external solder contacts for surface mount assembly of the MEMS sensor. Typical materials are HTCC (high temperature co-fired ceramic), LTCC (low temperature co-fired ceramic) or organic laminates (e.g. "FR4").

The MEMS chip is chosen from any micro structured sensor chip. Preferably the MEMS chip is a capacitive sensor for pressure or a microphone comprising a membrane as a moveable part and a rigid back plate forming the capacitor electrodes. The sensor may also be an acceleration sensor, a gyro sensor or a humidity or chemical sensor.

The sensing area of the MEMS chip usually complies with an outer surface of the MEMS chip. In the inventive MEMS sensor the sensing area can be arranged above and hence directly adjacent the filter mesh. However an inverse arrangement is possible too making the sensing area facing away from the carrier board.

The MEMS chip may be mounted by means of solder contact, bumps or glue. In the latter case an electrically conductive adhesive can provide mechanical and electrical contact to a contact pad of the carrier board. Alternatively, electrical contact can be provided by wire bonding.

The carrier board provides a contact pad on a top surface and outer contacts for surface mount assembly of the MEMS sensor.

The foil can be applied and attached to the surface of the carrier board in different ways. As an adhesive mounting is preferred it is necessary to use and apply a separate adhesive or to use a foil that is self-adhesive.

An adhesive can be applied to the surface of the carrier board directly in accordance with the required pattern, e.g. by dispensing, stamping or printing. The pattern comprises at least a margin area in the perimeter of the opening.

Alternatively the adhesive can be applied as an adhesive second foil or as a large-area layer of a viscous adhesive that is applied and attached to the carrier board covering the entire top surface of the board and in case of an adhesive foil also over the media access opening. The second (adhesive) foil has a preferred thickness in the range of 1 µm to 50 µm, more preferably around 10 µm. In a later step the second foil is structured by removing the foil everywhere but in the margin area in the perimeter of the opening that is required for gluing the second foil thereon. Hence, no adhesive foil remains over the media access opening.

A very suitable type of adhesive is a photoresist that allows for patterning by photolithography. In that case, the layer is exposed by a mask aligner. Alternatively direct imaging by a scanning laser (LDI) is possible. In a development step the unexposed foil areas are removed. Invers patterning can be done when using a positive resist.

Other patterning methods (e.g. laser ablation) may also be employed.

Onto the pattern of adhesive an unstructured foil can be applied and attached by laminating it to the entire top surface of the carrier board or to the pattern of adhesive. For good adhesion, heat and pressure may be applied. Due to its excellent mechanical strength and temperature resistance, polyimide (e.g. Kapton®) is well suited as foil. Aromatic polyamides like Kevlar® or Mictron® for example can be used too. The foil may be covered with a metal layer that can be applied after lamination of the foil. In case of existing features causing a topology to the carrier board surface, the foil may have corresponding openings. Curing recipes depending on the requirements of the adhesive may be applied.

The foil has then to be cut to easily remove the overhanging area of the foil so that the remaining foil that is covering the sound hole is held by the adhesive pattern or more generally by the adhesive effect of the foil or the applied adhesive. This cut may be done by a scanning laser, e.g. a UV laser with spot size <100 µm, but also by an excimer laser can be used.

In an alternative variant the steps of applying adhesive and laminating the foil to the adhesive pattern can be replaced by using a foil that is self-adhesive. In a preferred embodiment the foil comprises a polymer in a B stage and can be applied by lamination. After applying the foil is cured and hardened to provide the desired mechanical strength.

In a further alternative variant the adhesive may be applied to the bottom side of the foil at the entire area thereof or in a pattern before applying the foil to the carrier e.g. by lamination.

For subsequent flip chip assembly of the silicon die, solder bumps can be applied onto contact pads on the substrate. This can also be done in an earlier step, but a flat surface of the substrate facilitates the lamination processes of adhesive and foil. It is also possible to provide the solder bumps at the silicon die.

Later in the process, in an perforation area of the foil a perforation is formed or preformed as a regular pattern of holes or blind holes. The perforation area corresponds with at least the area of the media access opening. However larger or smaller perforation areas are possible too.

An advantageous hole pattern for the perforations consists of holes having a diameter of 5 µm arranged with a 7 µm pitch. Other patterns, pitches and non-circular holes may be used. The total opening ratio should be >30%, preferably around 50% or more with respect to the self-supporting area of the foil. A suitable tool for creating the holes is an excimer laser or a short-pulse scanning laser. As an alternative, photolithographical structuring and/or plasma etching can be applied.

In the next step the MEMS chip can be mounted by means of the bumps applied before such that sensing area of the MEMS chip and media access opening are arranged approximately coaxially.

Usually the MEMS chips needs to be sealed to the surface of the carrier board. This can be done by applying a sealing mass along the bottom edge of the MEMS chip along the whole perimeter. Other sealing methods comprise applying a sealing foil from the top to the MEMS chip and the carrier board thereby sealing the MEMS chip to the surface of the carrier board. In case of a capacitive sensor part of the sealing foil can be removed in the area of a recess in the chip above the membrane electrode.

Further components of the MEMS sensor may be mounted adjacent to the MEMS chip e.g. an ASIC providing signal amplification and further signal processing as well as a control of the sensor function. This and any additional chip can be sealed too by the sealing foil.

In a last step a cap can be mounted to the carrier board to enclose under its concave portion at least the MEMS chip. The cap may be mounted by using a glue.

In the following the invention will be explained in more detail with reference to preferred embodiments and the relating figures. The figures are schematically only for better understanding and not drawn to scale. Identical or equivalent parts are referenced by the same reference symbols.

Although the examples refer to a MEMS sensor embodied as a MEMS microphone a multitude other MEMS sensors can be embodied similar.

Figure 1:
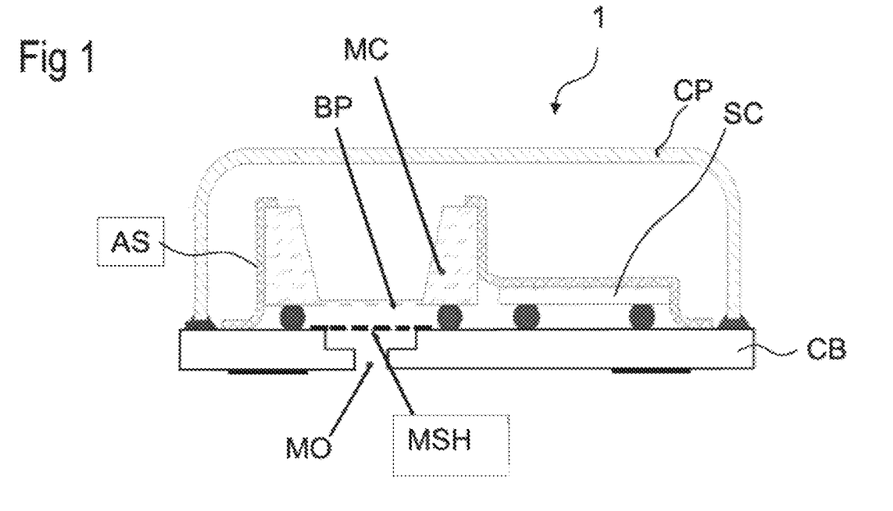
FIG. 1 shows in a cross sectional view a bottom port MEMS microphone according to the invention with a mesh comprising a foil with perforation.

FIG. 1 shows in a cross-sectional view a first embodiment of a MEMS microphone 1 according to the invention. The microphone comprises a MEMS chip MC that is mounted on a carrier board CB such that membrane and back plate BP of the MEMS chip MC are facing a media access opening MO in the carrier board CB. Further, the MEMS microphone 1 comprises an ASIC SC that is a small semiconductor chip that supports and controls the function the MEMS microphone 1.

A mesh MSH that has been formed by perforating a foil directly applied to the top surface of the carrier board CB spans over the media access opening MO and provides a particle filter detaining particles having a diameter greater that the diameter of the holes that form the perforation. A cap CP is glued or soldered onto the carrier board and encloses in its cavity the MEMS chip MC and the ASIC SC. An acoustic seal seals the MEMS chip MC and the AISC SC to the carrier board to provide a front volume for the microphone. Here, the acoustic seal comprises a foil laminated over the chips and structured to uncover the back plate BP.

Figure 2:
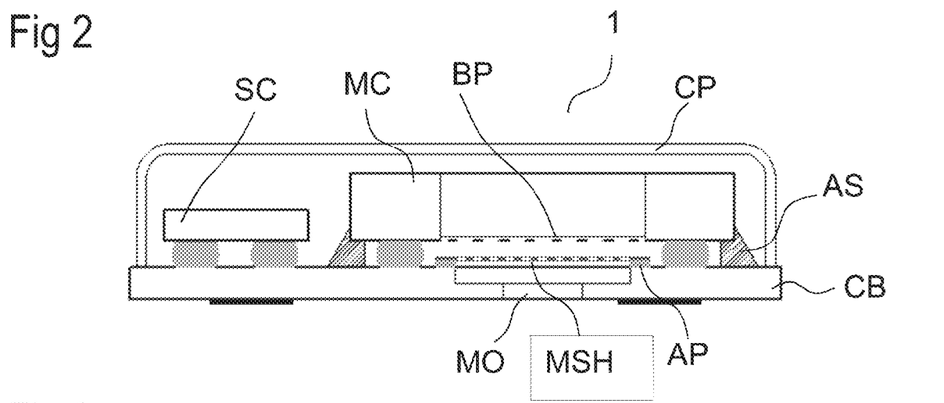
FIG. 2 shows in a cross sectional view a bottom port MEMS microphone according to the invention with a mesh comprising a foil with perforation mounted on a pattern of an adhesive.

FIG. 2 shows a similar MEMS microphone 1 with the difference, that the foil is attached to the carrier board by a pattern AP of adhesive. Further, the acoustic seal AS is applied to the bottom edges of the MEMS chip MC only along the perimeter thereof to seal only the MEMC chip to the surface of the carrier board CB.

Figure 3:
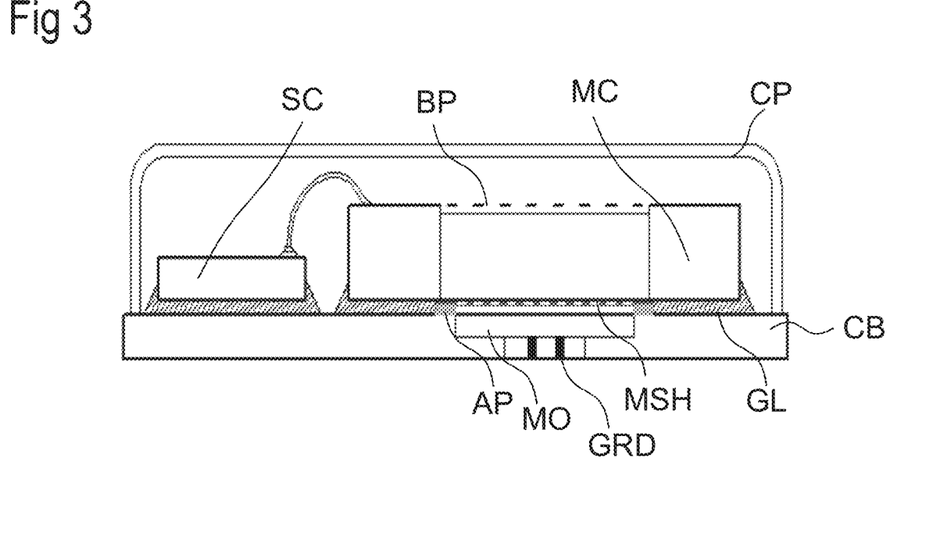
FIG. 3 shows in a cross sectional view a MEMS microphone with a mesh comprising a foil with perforation mounted on a pattern of an adhesive with an arrangement of the MEMS chip inverse to that of FIG. 2.

FIG. 3 shows a similar MEMS microphone with the difference, that the MEMS chip MC and an ASIC SC are attached using an adhesive GL. The back plate is oriented opposite to the carrier board. The MEMS chip can sit on a margin of the foil F with the perforation forming the mesh MSH. The foil is attached by a pattern AP of adhesive. Electrical contacting of MEMS chip and ASIC SC is done via bonding wires.

Figure 4:
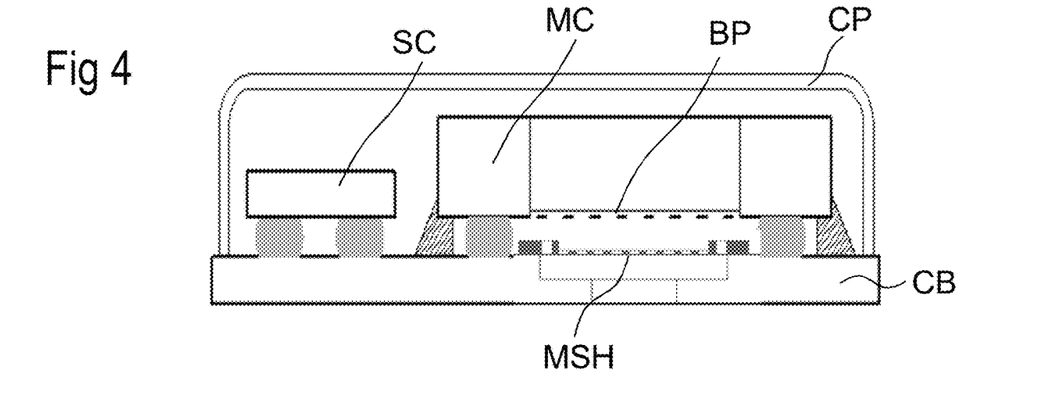
FIG. 4 shows in a cross sectional view a MEMS microphone with a mesh comprising a foil with perforation having a reduced thickness in a central area thereof.

FIG. 4 shows a MEMS microphone similar to that one shown in FIG. 2 with the difference, that the foil is thinned from the top in a central part. Hence, a margin of the foil F beyond the area of perforation and being in contact with the carrier board has a greater thickness. The mesh MSH comprising the perforation covers the media access opening MO.

Figure 5:
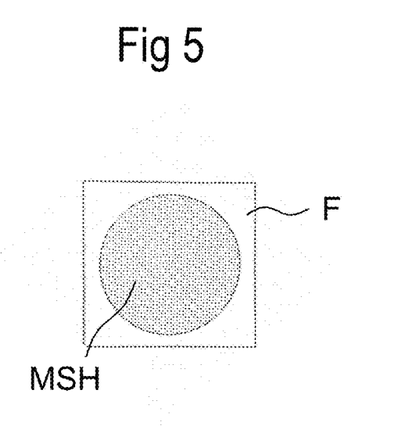
FIGS. 5 to 7 show different shapes of foils as can be used in MEMS microphones according to the invention.

FIG. 5 shows in a top view a foil F with a perforation forming a mesh MSH. The foil is structured rectangular to be placed between the bumps.

Figure 6:
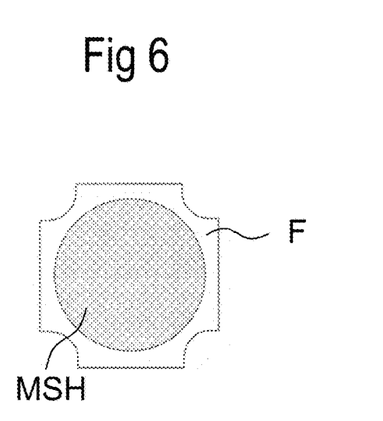

FIG. 6 shows in a top view a foil F a shape having concavely rounded corners. In the concave recess the bumps for mounting the MEMS chip MC can be placed.

Figure 7:
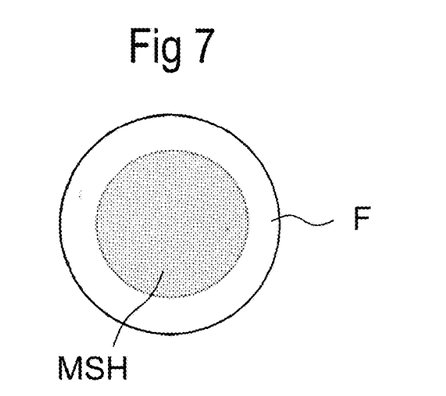

FIG. 7 shows in a top view a foil F a round shape. However, the foil F may have any other shape without departing from the invention.

FIGS. 8a to 8H show in a cross sectional view a MEMS microphone after different steps of manufacture.

Figure 8:
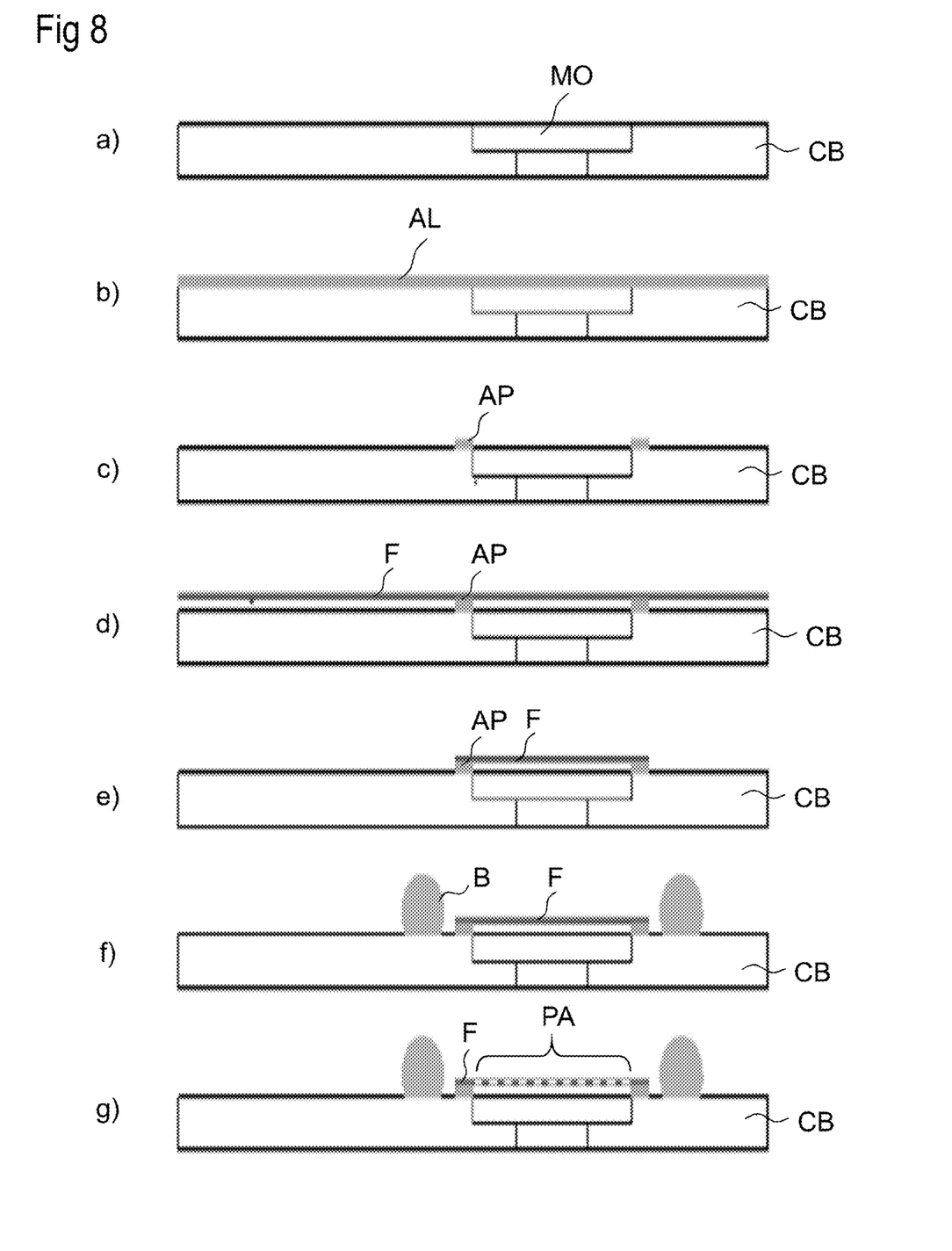
FIGS. 8a to 8h show in a cross sectional view a MEMS microphone after different steps of manufacture.

FIG. 8a shows a carrier board CB in cross section. It consists of a multilayer laminate with internal electrical connections, vias, and external solder contacts (not shown) for surface mount assembly. Typical materials are HTCC (high temperature co-fired ceramic), LTCC (low temperature co-fired ceramic) or organic laminates (e.g. "FR4"). A media access opening is located in the board CB providing access for external sound pressure to enter the package. As illustrated, this hole may have different size in the various layers. It is also possible, that there's one hole in one layer, and a plurality of smaller holes in another layer. The shape of the holes may be circular or other. Only one unit site is shown. In preferred embodiments of the invention, an arrangement of a plurality of such units formed on the same carrier board ("panel") is processed in parallel. The singularization (i.e. cutting into individual components) is done after executing several or all steps of the method.

FIG. 8b shows the carrier board after coating with a thin layer of adhesive AL, typically in a thickness between 1 μm to 50 μm, preferably around 10 μm.

FIG. 8c: The adhesive layer AL has been patterned. A very suitable type of adhesive allows for patterning by photolithography. In that case, the layer is exposed by a mask aligner or scanning laser direct imaging (LDI) and then developed. Other patterning methods (e.g. laser ablation) may be employed. As an alternative, the step in FIG. 8b can be omitted and the adhesive is directly applied according to the required pattern, e.g. by dispensing, stamping or printing. Regardless of the method, a high viscosity (>10 Pas) of the adhesive is advantageous. Preferably the adhesive can have thixotropic properties, and is, further preferable, a solid polymer in "B stage" that will melt under heat and pressure before it starts curing. The adhesive chemistry may be based on epoxy, imide, acrylate, or mixtures. Most adequate patterns are closed rings around the media access opening MO. But there may also be additional areas at other locations.

FIG. 8d: A thin foil (typical thickness 1 μm to 10 μm) is laminated onto the adhesive pattern AP across the whole carrier board. For good adhesion, heat and pressure may be applied. Due to its excellent mechanical strength and temperature resistance, polyimide (e.g. Kapton®) is well suited. Other polymers or metal films may also be used. In case of existing features causing a topology to the carrier board surface, the foil F may have corresponding openings. Curing recipes depending on the requirements of the adhesive may be applied.

FIG. 8e: The foil F has been cut so that the remaining foil covering the media access opening MO is held by the adhesive pattern AP, while the surrounding foil is removed easily. This cut may be achieved by a scanning laser, e.g. a UV laser with spot size <100 μm or by an excimer laser.

FIG. 8f: For subsequent flip chip assembly of the MEMS chip MC, solder bumps B are applied onto contact pads on the carrier board CB. This can also be done in an earlier step, but a flat surface facilitates the lamination process. It is also possible to provide the solder bumps on the MEMS chip MC.

FIG. 8g: Now the perforation is applied. An advantageous pattern consists of holes with a diameter of 5 µm arranged in a 7 µm pitch to achieve high acoustic transparency. In general, hole dimensions from 1 µm to 10 µm may be useful. The smallest distance between the holes is 1 µm when measured from edge to edge. Other patterns, pitches and non-circular holes may be used. The total opening ratio should be >30%, preferably around 50% or more with respect to the self-supporting area (perforation area over the media access opening) of the foil. A suitable tool for creating the holes is an excimer laser or short-pulse scanning laser. As an alternative, photolithographical structuring can be applied.

FIG. 8h: A MEMS chip was soldered onto the solder bumps B.

FIGS. 9d to 9i show in a cross sectional view different process stages of an alternative process of manufacturing a MEMS microphone. This method In this alternative process flow, the laser used for drilling the perforations does not have to drill through the whole polymer foil, but only through a very thin (0.1 µm-1.0 µm) etch mask layer, preferrably a metal layer ML like Ti, Al, or Cr sputtered onto the polymer foil F. By this blind holes BH are produced.

Figure 9:
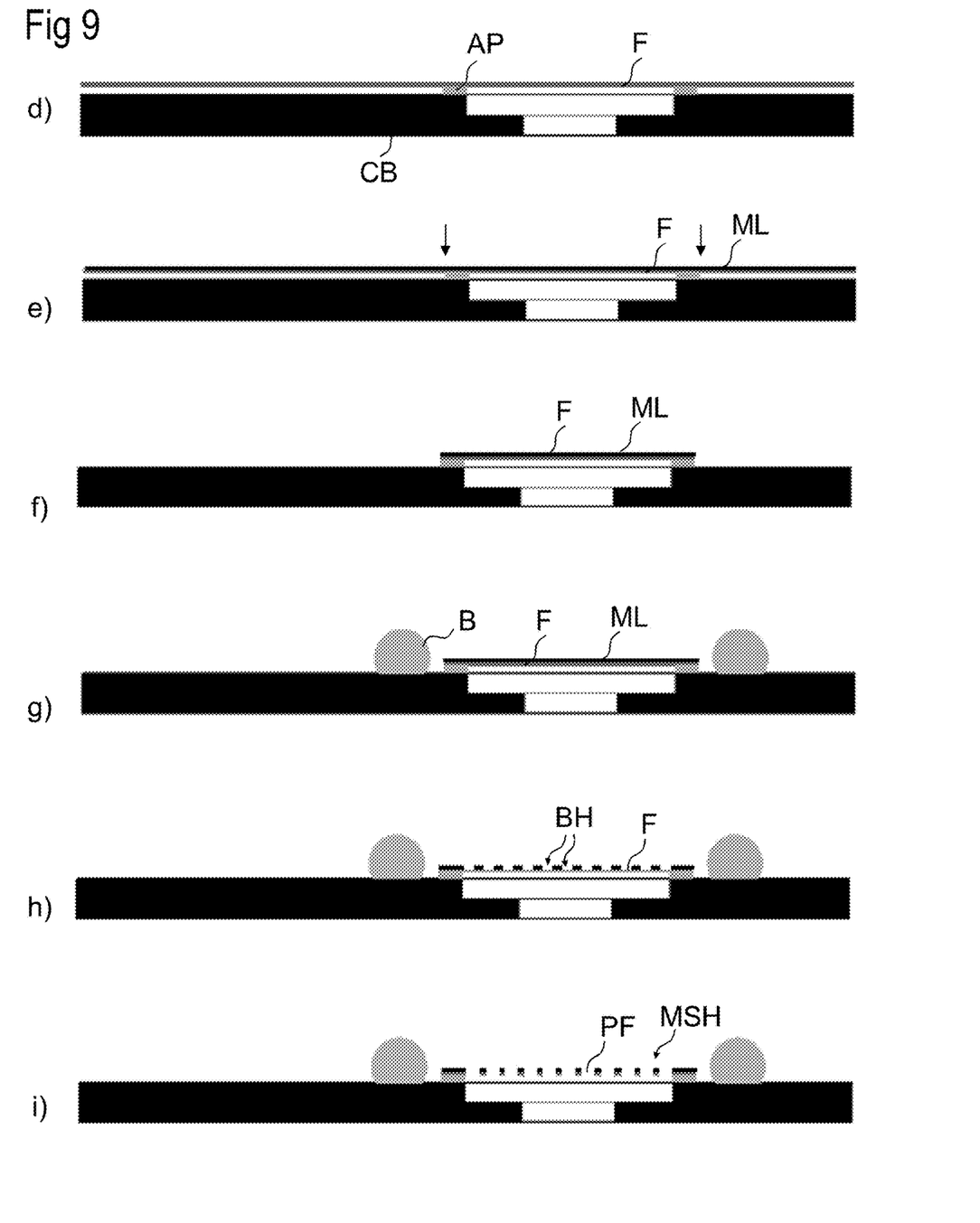
FIGS. 9d to 9i show in a cross sectional view different process stages of an alternative process of manufacturing a MEMS microphone.

In a next step, the hole pattern is etched through the polymer foil by means of a plasma etching process (e.g. RIE, reactive ion etching, using gases like $O_2$, $CF_4$, $SF_6$ or the like, or mixtures thereof). An anisotropic etching characteristic is preferred.

This method makes it much easier to achieve a proper hole geometry in terms of well defined shape and cross section, and narrow pitch on the one hand. It requires only a very short laser processing time with low thermal influence on the other hand.

It is not necessary to remove the etch mask i.e. the perforated metal layer ML subsequently, because this layer does not contribute significantly to the thickness of the filter mesh MSH. Thus, there is practically no degradation of the acoustical performance of the microphone. Rather, this metal layer ML adds very advantageous features to the assembly, as it
- helps to shield light and infrared radiation from entering the sound port of the microphone, which otherwise could affect the semiconductor chips contained in the microphone package together with the MEMS chip by generating leakage currents. This would result in noise
- improves the protection of the component against electromagnetic interference and electrostatic discharge, particularly when the metal layer ML is connected to ground by any suitable means.

The alternative process starts with FIG. 9d showing the same stage like FIG. 8d of the first alternative explained above. The foil F of e.g. 5 µm polyimide has been laminated onto the adhesive pattern AP applied onto the surface of circuit board CB.

Onto the foil F a thin metal layer ML e.g. 200 nm of Ti is deposited e.g. by sputtering. FIG. 9e shows the arrangement at this stage. Further shown are arrows pointing to a cutting line used for structuring the foil F together with the metal layer ML thereupon. FIG. 9f shows the foil F with the metal layer structured e.g. by a circular $CO_2$ laser cut. The area is now restricted to cover the media access opening MO plus a margin at the perimeter of the opening.

According to FIG. 9g bumps B are applied to the circuit board for later mounting the MEMS chip thereon.

FIG. 9h shows a stage where a pattern of blind holes BH have been drilled by a laser. The blind holes do not go through the whole polymer foil, but only through the very thin structured metal layer ML.

In the next step according to FIG. 9i the perforations PF have been completed by etching through the metal layer ML by means of a plasma etching process (e.g. RIE, reactive ion etching, using gases like $O_2$, $CF_4$, $SF_6$ or the like, or mixtures thereof). Preferably an anisotropic etching characteristic is set.

Thereafter, the manufacture of the MEMS sensor is completed as described before.

In a further alternative embodiment a thicker foil F (of about 10 µm to 50 µm) is used, particularly a foil with an adhesive layer on its lower surface, or with an inherent stickiness. In that case, the steps shown in FIGS. 8b and 8c are not required. For acoustical reasons it may be necessary to locally reduce the thickness in the central area down to 1 µm to 10 µm. It is possible to do this with the same excimer laser. The so produced MEMS sensor is depicted in FIG. 4. In a similar approach local thinning of the foil in a central area is performed from the opposite side of the foil F.

Notwithstanding the number of exemplary embodiments the invention is not restricted to the shown embodiments. The MEMS chip can be of any kind of a sensing chip requiring a media access.

The scope of the invention shall only be limited by the wording of the claims.

LIST OF USED REFERENCE SYMBOLS

1 MEMS sensor
AL adhesive layer
AP adhesive pattern
AS acoustic seal
B bump
BH blind hole
BP back plate
CB carrier board
CP cap
DL dielectric layer with
F foil
GL adhesive
GRD filter grid
MC MEMS chip
ML metal layer
MO media access opening
MSH filter mesh
PA perforation area
PF perforation
SC ASIC

The invention claimed is:

1. A method of manufacturing a MEMS sensor, the MEMS sensor comprising a carrier board with a media access opening, a MEMS chip mounted on the carrier board above the media access opening, and a film applied on a surface of the carrier board facing the MEMS chip and covering the media access opening, the method comprising the steps of:
   providing the carrier board having the media access opening;
   applying the film onto a top surface of the carrier board completely covering the media access opening, wherein the film consists of an organic material and is mounted on the carrier board by gluing;

providing perforations in a perforation area of the film, the perforation area extending at least partly over an area of the media access opening;

mounting the MEMS chip having a surface with a sensing area on the top surface of the carrier board such that a medium to be sensed can reach the sensing area through the media access opening, and wherein the film includes a polymer in a B stage acting as film and adhesive, the film is applied by lamination, and the film is cured after applying.

2. The method of claim 1, wherein the film is applied to the entire top surface of the carrier board wherein the film, after applying, is structured to be restricted in area to the area of the media access opening on the top surface plus a margin area around a perimeter of the media access opening, wherein the film is glued to the top surface of the carrier board in the margin area, wherein forming the perforations and structuring the film are performed in the same step with the same method.

3. The method of claim 1, wherein the film is applied to the entire top surface of the carrier board wherein the film, after applying, is structured to be restricted in area to the area of the media access opening on the top surface plus a margin area around a perimeter of the media access opening, wherein the film is glued to the top surface of the carrier board in the margin area, wherein the perforations are at first preformed as blind holes, wherein a plasma etching step is performed later to etch the blind holes until the perforations are through-going through the film.

4. The method of claim 1, wherein a laser is used for structuring the film and for forming the perforations or blind holes.

5. The method of claim 1, further comprising applying a metal layer to an entire surface of the film, forming blind holes at least through the metal layer to form an etch mask for the later forming of perforations by etching.

6. The method of claim 1, wherein a photolithographical structuring is used for forming the perforations and/or structuring the film.

7. The method of claim 1, wherein the mounting the MEMS chip to the carrier board comprises soldering or gluing, and wherein, after mounting thereof, the MEMS chip is sealed to the top surface of the carrier board by a sealing to enclose a volume between MEMS chip, sealing and the carrier board, wherein the perforation area is completely arranged within said volume.

8. The method of claim 1, wherein a package is formed by applying a cap over the MEMS chip and sealing it to the top surface of the carrier board thereby enclosing the MEMS chip and at least another chip necessary for the operation of the MEMS chip between the cap and the carrier board.

9. The method of claim 1, wherein the material of the film includes polymer, polyimide foil, aromatic polyamides polymer foil, or metal foil.

10. The method of claim 1, wherein the film has a thickness of about 1 µm to 10 µm in the area of the media access opening.

11. The method of claim 1, wherein the perforations include a plurality of holes arranged in a regular pattern to provide an area ratio of perforations relative to the perforation area of 30% or more or 50% or more, each of the plurality of holes having a diameter of 2 µm to 10 µm.

12. The method of claim 1, wherein the MEMS chip has a sensing surface, and wherein the MEMS chip is mounted to the carrier board above the film thereby keeping a distance between the perforation area of the film and the sensing surface of at least 10 µm or at least 50 µm.

13. The method of claim 1, wherein the MEMS chip is mounted to the carrier board in a flip-chip assembly.

14. The method of claim 1, wherein the carrier board has a multilayer structure of at least two dielectric layers sandwiching a wiring layer therebetween;

wherein the media access opening is structured individually in at least one layer;

wherein one of the dielectric layers includes one or more throughgoing holes in the area of the media access opening to provide a filter grid spanning across the media access opening;

wherein the diameter of the holes of the filter grid is at least 10 times greater than the diameter of the perforations.

15. A method of manufacturing a MEMS sensor, the MEMS sensor comprising a carrier board with a media access opening, a MEMS chip mounted on the carrier board above the media access opening, and a film applied on a top surface of the carrier board facing the MEMS chip and covering the media access opening, the method comprising the steps of:

providing the carrier board having the media access opening;

applying the film onto a top surface of the carrier board completely covering the media access opening;

providing perforations in a perforation area of the film, the perforation area extending at least partly over an area of the media access opening;

mounting the MEMS chip having a surface with a sensing area on the top surface of the carrier board such that a medium to be sensed can reach the sensing area through the media access opening, and wherein the film is applied to the entire top surface of the carrier board, wherein the film, after applying, is structured to be restricted in area to the area of the media access opening on the top surface plus a margin area around a perimeter of the media access opening, wherein the film is glued to the top surface of the carrier board in the margin area, wherein providing the perforations and structuring the film are performed in the same step with the same method.

16. A method of manufacturing a MEMS sensor, the MEMS sensor comprising a carrier board with a media access opening, a MEMS chip mounted on the carrier board above the media access opening, and a film applied on a top surface of the carrier board facing the MEMS chip and covering the media access opening, the method comprising the steps of:

providing the carrier board having the media access opening;

applying the film onto the top surface of the carrier board completely covering the media access opening;

providing perforations in a perforation area of the film, the perforation area extending at least partly over an area of the media access opening;

mounting the MEMS chip having a surface with a sensing area on the top surface of the carrier board such that a medium to be sensed can reach the sensing area through the media access opening, and wherein the film is applied to the entire top surface of the carrier board, wherein the film, after applying, is structured to be restricted in area to the area of the media access opening on the top surface plus a margin area around a perimeter of the media access opening, wherein the film is glued to the top surface of the carrier board in the margin area, wherein the perforations are at first preformed as blind holes, and wherein a plasma etching step is performed later to etch the blind holes until the perforations are through-going through the film.

\* \* \* \* \*